United States Patent
Kornev et al.

(10) Patent No.: US 8,933,695 B1
(45) Date of Patent: Jan. 13, 2015

(54) HIGH LINEARITY SUPERCONDUCTING RADIO FREQUENCY MAGNETIC FIELD DETECTOR

(75) Inventors: Victor K. Kornev, Moscow (RU); Igor I. Soloviev, Moscow (RU); Nikolai V. Klenov, Troitsk (RU); Oleg A. Mukhanov, Putnam Valley, NY (US)

(73) Assignee: Hypres, Inc., Elmsford, NY (US)

( * ) Notice: Subject to any disclaimer, the term of this patent is extended or adjusted under 35 U.S.C. 154(b) by 424 days.

(21) Appl. No.: 13/471,674

(22) Filed: May 15, 2012

Related U.S. Application Data

(63) Continuation of application No. 12/543,482, filed on Aug. 18, 2009, now Pat. No. 8,179,133.

(60) Provisional application No. 61/089,861, filed on Aug. 18, 2009.

(51) Int. Cl.
*G01R 33/02* (2006.01)

(52) U.S. Cl.
USPC .......................... 324/248; 324/225; 505/846

(58) Field of Classification Search
None
See application file for complete search history.

(56) References Cited

U.S. PATENT DOCUMENTS

| | | | | |
|---|---|---|---|---|
| 4,344,052 A | * | 8/1982 | Davidson | 333/222 |
| 4,470,023 A | * | 9/1984 | Lukens et al. | 331/107 S |
| 5,153,171 A | * | 10/1992 | Smith et al. | 505/210 |
| 6,690,162 B1 | * | 2/2004 | Schopohl et al. | 324/248 |
| 6,919,579 B2 | * | 7/2005 | Amin et al. | 257/31 |
| 7,863,892 B2 | * | 1/2011 | Morley et al. | 324/248 |

* cited by examiner

*Primary Examiner* — Minh N Tang
(74) *Attorney, Agent, or Firm* — Steven M. Hoffberg; Ostrolenk Faber LLP

(57) ABSTRACT

A superconducting quantum interference devices (SQUID) comprises a superconducting inductive loop with at least two Josephson junction, whereby a magnetic flux coupled into the inductive loop produces a modulated response up through radio frequencies. Series and parallel arrays of SQUIDs can increase the dynamic range, output, and linearity, while maintaining bandwidth. Several approaches to achieving a linear triangle-wave transfer function are presented, including harmonic superposition of SQUID cells, differential serial arrays with magnetic frustration, and a novel bi-SQUID cell comprised of a nonlinear Josephson inductance shunting the linear coupling inductance. Total harmonic distortion of less than −120 dB can be achieved in optimum cases.

20 Claims, 14 Drawing Sheets

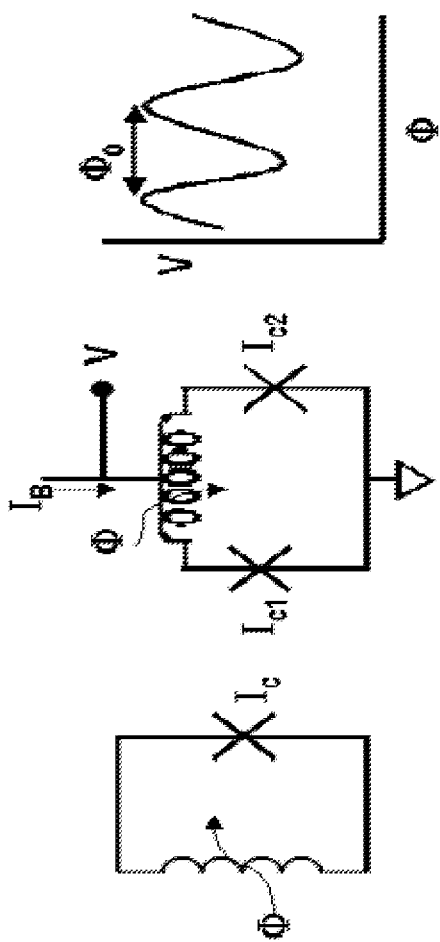
Fig. 1A Prior Art
Fig. 1B Prior Art
Fig. 1C Prior Art
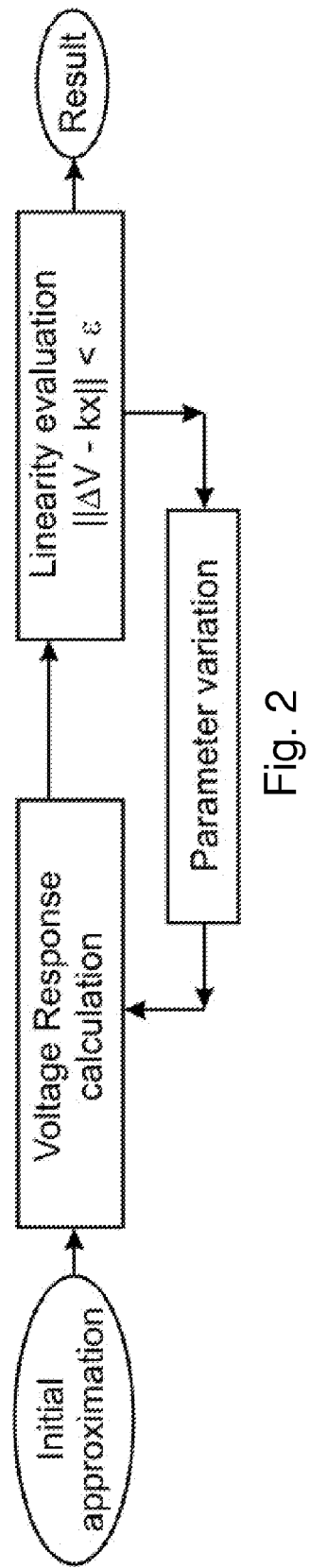
Fig. 2

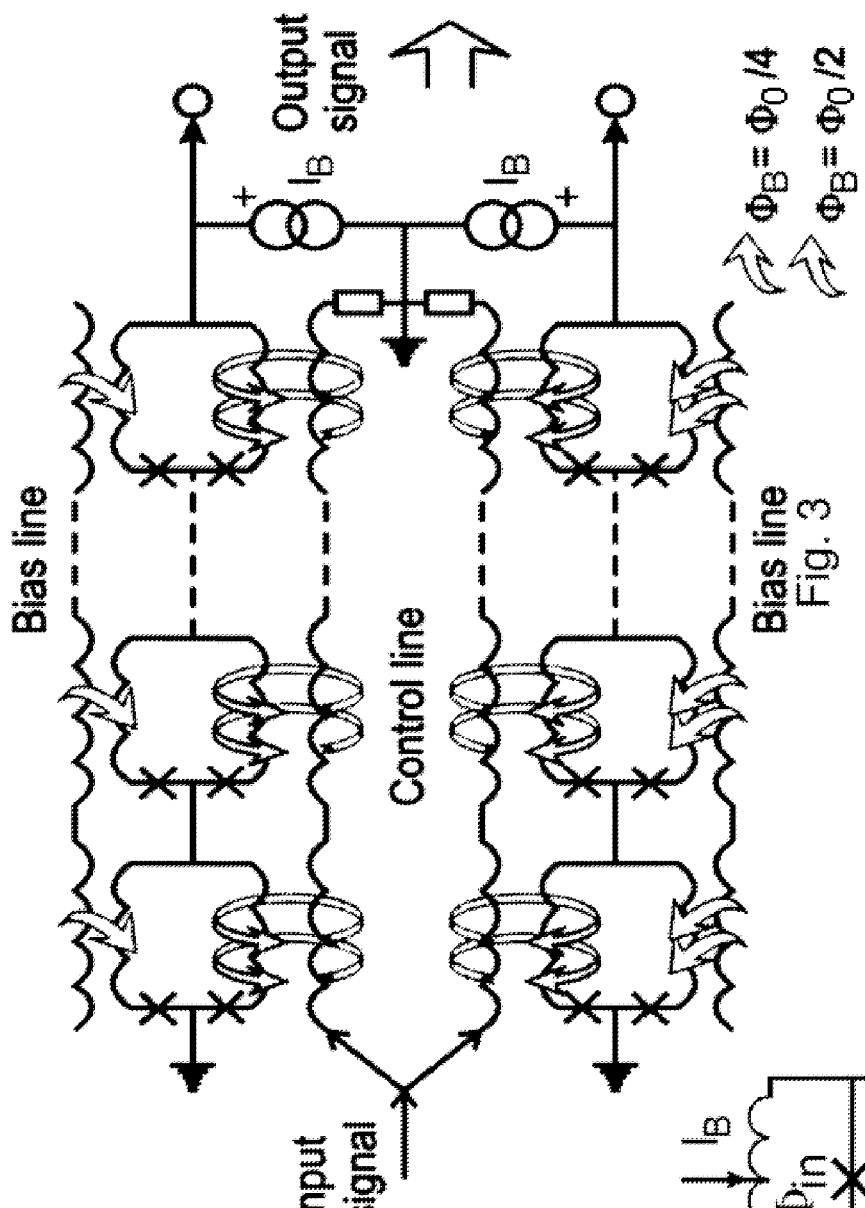

HIGH LINEARITY SUPERCONDUCTING RADIO FREQUENCY MAGNETIC FIELD DETECTOR

CROSS REFERENCE TO RELATED APPLICATIONS

The present application is a continuation of U.S. patent application Ser. No. 12/543,582, filed Aug. 18, 2009, now U.S. Pat. No. 8,179,133, which issued May 15, 2012, which claims benefit of priority from U.S. Provisional Patent Application No. 61/089,861, filed Aug. 18, 2008, the entirety of which are expressly incorporated herein by reference.

STATEMENT OF GOVERNMENT RIGHTS

This invention was made in part with government support under the US Office of Naval Research CRDF Grant RUP1-1493-MO-05. The US government has certain rights in this invention.

FIELD OF THE INVENTION

The present invention relates to the field of detectors and devices for magnetic fields, and more particularly to magnetic field detectors that operate at radio frequencies.

BACKGROUND OF THE INVENTION

The Superconducting Quantum Interference Device, or SQUID, is well known as a sensitive detector of weak magnetic fields. As indicated in FIG. 1, a SQUID is comprised of a superconducting loop containing one or more Josephson junctions (indicated by X in FIG. 1), and magnetic flux $\Phi$ is inductively coupled into the loop through a coupling inductor L. A Josephson junction is known to act as a lossless nonlinear inductance below its critical current $I_c$, and also exhibits nonlinear resistance above $I_c$. A one-junction SQUID (FIG. 1A) comprises a single junction and a loop, and exhibits a nonlinear impedance which depends on the flux $\Phi$ in a periodic manner, with periodicity $\Phi_0 = h/2e = 2.07$ fT-m², where h is Planck's constant and e is the charge on the electron. The one-junction SQUID does not have a direct voltage readout since the junction is shunted by a lossless superconducting inductor, so it must be embedded in a radio-frequency (RF) circuit for its impedance to be measured. For this reason, this structure is sometimes called an RF-SQUID, although the flux $\Phi$ can be at any frequency down to DC. Another SQUID device is the two-junction SQUID (FIG. 1B), which is generally operated with a DC bias current greater than the device critical current $I_c = I_{c1} + I_{c2}$ of the two constituent junctions. This then exhibits a DC voltage output across the Josephson junctions, modulated by the flux $\Phi$ in a way that is again periodic in $\Phi_0$ (FIG. 1C). This two-junction SQUID was historically called the DC-SQUID, since it operates down to DC frequencies, although it may alternatively operate with flux modulation up to gigahertz radio frequencies. The DC SQUID is much more commonly used than the RF SQUID, so in general usage, the term SQUID commonly refers to two-junction SQUID. Such a SQUID may be used not only for low-frequency magnetic field detectors, but also for radio-frequency amplifiers and active radio antennas if appropriate inductive inputs are used.

Both high-$T_c$ and low-$T_c$ superconductor based SQUID-amplifiers have been studied during the past ten years [7], [8], [9], [15], [16], [17]. See also Hilbert, U.S. Pat. No. 4,585,999, "RF amplifier based on a DC SQUID". However, the characteristics of the amplifiers are still far from desired performance values. Despite the fact that the noise temperature $T_n \approx 1$-3 K [15] is reasonably low, the dynamic range (amplitude ratio) $D = (T_{sat}/T_n)^{1/2}$ of the amplifiers is strongly limited by their saturation temperature $T_{sat}$, which is as low as 100-150° K. [7], [15], [16]. The other disadvantage of the SQUID-amplifiers is a narrow range of linearity of the transfer function. Implementation of a flux-locked-loop operating mode can substantially increase dynamic range and linearity, but at the same time the external feed-back loop will limit the maximum operation frequency to a few tens of megahertz at best. Therefore an internal negative feedback has been suggested in order to increase dynamic range and to linearize the transfer function of such an amplifier [8], [9]. However this is very problematic given typical low values of the SQUID-amplifier gain [7], [15], [16] of 10-15 dB, since higher amplification gain is needed to effectively achieve the negative feedback. What is needed is a way to use arrays of SQUIDs to achieve both greater dynamic range and greater linearity, without requiring such negative feedback. Linearity is particularly important for processing signals at radio frequencies, where a nonlinear transfer function can give rise to undesired harmonics and intermodulation products.

One approach to overcoming the drawbacks of SQUID-amplifiers is associated with multi-element Josephson structures and arrays, including Superconducting Quantum Interference Filters (SQIF). See Schopohl, U.S. Pat. No. 6,690,162, "Device for High Resolution Measurement of Magnetic Fields"; Oppenlander, U.S. Pat. No. 7,369,093, "Superconducting Quantum Antenna." A SQIF is an array (parallel, series or parallel-series) of DC SQUIDs with an unconventional array structure [10-12]. The SQIF voltage response is characterized by a single sharp peak. Contrary to the usual SQUID, which shows unique properties due to the strict periodicity of its structure, the unique properties of the SQIF result from just the opposite, an unconventional non-periodic array structure. SQIFs are therefore a new development of an intelligent network of SQUIDs. SQIFs certainly offer an approach to achieving increased dynamic range, but this approach does not offer a clear way to achieve linearization of these fundamentally nonlinear devices.

SUMMARY OF THE INVENTION

The present invention takes a novel approach in combining nonlinear Josephson junctions and SQUIDs in a way that cancels their mutual nonlinearities, to achieve an overall device where the total nonlinearities have been significantly reduced or eliminated.

Recently, an approach to synthesis of multi-SQUID structures capable of providing high linearity voltage response has been reported by the present inventors [1,2]. The approach is based on formation of serial structures which are able to provide a periodic triangular voltage response to a homogeneous magnetic field B with "spatial frequency" spectrum as follows:

$$V(B) = \sum_k A_k \cos(k\omega_0 B), \quad A_k = A_0 \sum_k \frac{\sin^2(k\omega_0 \Delta B/2)}{(k\omega_0 \Delta B/2)^2}, \quad (1)$$

where $2\Delta B$ is width of the triangular pulse with repetition cycle $B_T = 2\pi/\omega_0$. Such a triangular transfer function is quite linear for flux maintained on a single leg of the triangle, in contrast to the more typical SQUID transfer function that is closer to a sinusoid. The present invention discloses three novel approaches to achieving a piecewise linear triangle wave transfer function.

1) Harmonic Superposition

The first approach is to use interferometer (SQUID) cells providing harmonic (sinusoidal) voltage response with "spatial frequency" $k\omega_0=(2\pi/\Phi_0)\cdot a_k$, where $a_k$ is effective area of the interferometer cell which belongs to the k-th group. In the case when the input signal is a control line current I (instead of B), the effective area should be replaced by the mutual inductance $M_k$, i.e., $k\omega_0=(2\pi/\Phi_0)\cdot M_k$. FIG. 2 shows a crude block diagram of an algorithmic flowchart to optimize the linearity with this approach. The voltage for the series array corresponds to the sum of the contributions from the individual cells, as in Equation (1).

It is significant that the spectrum of the triangle wave voltage response with minimum period $B_T=2\Delta B$ contains only odd harmonics with amplitudes decreasing monotonically with harmonic number k as $1/k^2$:

$$A(k\omega_0)=A_0/k^2, k=2n-1, n=1,2,\ldots \quad (2)$$

2) Differential Magnetic Frustrated Arrays

The second way is to make a differential scheme, using serial arrays of interferometer cells biased by current $I_b=I_C$, where $I_C$ is the interferometer critical current (the sum of the critical currents of the two junctions). The voltage response of such an array is characterized by numerous harmonics with monotonically decreasing amplitudes:

$$A(n\omega_0) = \frac{A_0}{n^2 - 1}. \quad (3)$$

Apart from a few first harmonics, the amplitude decrease law is quite close to $1/n^2$, as for the triangle wave A differential scheme of two serial arrays, each periodic in $\Phi_0$, but with a relative offset of $\Phi_0/2$ between them (known as "frustration") causes the voltage output of the two arrays to be out of phase, which provides subtraction of all even harmonics, and therefore the resulting response becomes very close to the triangular one with $B_T=\Delta B$. A differential output also exhibits practical advantages in terms of avoidance of interference and noise.

FIG. 3 shows schematically the differential array structure and magnetic biasing of the arrays. One can further increase the linearity of the differential array circuit voltage response. For this purpose, we should add to the array structure a few cells with sinusoidal responses. These cells are DC SQUIDs biased well above critical current ($I_b>2I_c$). These additional cells are to correct the initial spectral components in (3) in order to approach the desired spectrum (2). FIG. 1 shows a differential array structure consisting of two series arrays of DC interferometers with biasing $I_b=I_c$, where $I_c$ is the critical current of the interferometers. In one of the arrays each cell is biased by magnetic flux $\Phi_0/2$. Additional flux $\Phi_0/4$ is applied to all the cells to set the operating point in the center of the linear regime.

If the interferometer cells in both serial arrays are replaced by parallel SQUID arrays, a high-performance parallel-series differential structure results. In order to maximize the linearity in such parallel-series structure, one should select parallel array parameters, (e.g. SQUID cell area distribution). In order to find an optimal distribution of cell parameters, one can use an iterative algorithm to find the problem solution, starting from some initial approximation. FIG. 2 shows a crude block diagram of an algorithmic flowchart to optimize the linearity with this approach.

One aspect of the present inventions relates to such a differential structure. Considerable increase in the voltage response linearity results from the use of parallel SQIFs [3] with this structure instead of ordinary parallel arrays.

3) Modified SQUID Cells

In a third preferred embodiment, the basic SQUID cell itself is modified. This novel modified SQUID, shown schematically in FIG. 4, is called the bi-SQUID. Here the linear coupling inductance of the SQUID is modified by shunting with a nonlinear inductive element, a third Josephson junction below its critical current. Surprisingly, this nonlinear element modifies the nonlinear transfer function of the SQUID to produce a linear transfer function for appropriately chosen parameters. The nonlinear small-signal shunt inductance is given by the Josephson inductance $$L_J=\Phi_0/2\pi(Ic_3^2-I_{sh}^2)^{0.5}, \quad (4)$$

where $I_{c3}$ is the critical current of the shunt junction, and $I_{sh}$ is the current passing through the junction. The effective loop inductance is the parallel combination of the main inductance L and the Josephson inductance $L_J$. The loop comprising the additional junction and the main inductance forms a single-junction SQUID, so that one may call this modified SQUID a bi-SQUID. FIG. 4 also shows the voltage response of both the conventional two-junction SQUID (dashed line) and the bi-SQUID (solid line), for identical junctions J1 and J2 with critical current $I_c/2$ and shunt junction critical current $I_{c3}=1.15$ $I_c$, with linear inductance $L=\Phi_0/2\pi I_c$ and bias current $I_B=2I_c$. This shows a triangular transfer function where the triangle edges are quite straight, in contrast to the conventional two-junction SQUID with a transfer function that is closer to $|\sin(\Phi_e/2\pi\Phi_0)|$. Thus, this bi-SQUID uses a Josephson junction as a nonlinear inductive element which can largely cancel the nonlinearity otherwise associated with the SQUID transfer function.

It is noted that while the linearized SQUID cells and arrays of the present invention are generally periodic in magnetic flux with period $\Phi_0$, the periodicities in terms of current and magnetic field depend on effective coupling loop mutual inductances and areas. Therefore, such linearized devices with different effective areas (and thus periodicities) may be combined in series arrays to achieve a new device whereby the periodicity of the total voltage output is altered or even eliminated, in much the same way that conventional SQUIDs are combined to forms SQIFs with increased dynamic range in a single response near zero flux. Such a SQIF-like device based on elements of the present invention would maintain the high linearity of its components, while also achieving an enhanced dynamic range and increased output voltage response.

It is therefore an object to provide a superconducting detector for a magnetic field, adapted to provide a linear detector output over a range of an applied magnetic field, and corresponding method, comprising: a superconducting quantum interference device having a device output which is non-linear with respect to variations of an applied magnetic flux, the applied magnetic flux being a function of at least the applied magnetic field; and at least one Josephson junction having a non-linear response, the superconducting quantum interference device and the at least one Josephson junction being together configured and having appropriate operational parameters such that the non-linear response of the at least one Josephson junction compensates the non-linear response of the device output, such that over the range of the applied magnetic field, the detector output is substantially linear.

It is also an object to provide a method for linearizing an output of a superconducting detector for a magnetic field, adapted to provide a detector output, comprising a superconducting quantum interference device (SQUID) having a SQUID output which has a response pattern which is periodic and substantially non-linear with respect to variations of magnetic flux, the magnetic flux being a function of magnetic field, comprising compensating the SQUID output with at least one superconducting element having a nonlinear impedance, wherein the SQUID and the at least one superconducting element are appropriately configured and operated under such conditions to thereby linearize at least a portion of a quarter of a period of the periodic and substantially non-linear response of the SQUID output, to produce the detector output which is a substantially linear function of the magnetic field.

It is a further object to provide a magnetic field detector array, and corresponding method, comprising a plurality of superconducting quantum interference devices and a common output, each having an intrinsic response which is periodic and non-linear with respect to magnetic flux, the magnetic flux being a function of a magnetic field, the plurality of superconducting quantum interference devices each having a respective effective cell area, the respective effective cell areas of the plurality of superconducting quantum interference devices being non-uniformly distributed, the array being appropriately configured such that the each of the plurality of superconducting quantum interference devices provides a contribution to the common output, and wherein the common output is substantially linear with respect to changes in magnetic field over a range of magnetic fields outside of a null field, for which no one of the plurality of superconducting quantum interference devices is substantially linear.

The linear detector output is typically periodic in the magnetic field (that is, having a periodic non-monotonic variation with respect to changes in magnetic field), having an ascending linear portion and a descending linear portion, corresponding to a triangle wave.

The linear detector input and/or output may comprise a radio-frequency signal.

The superconducting quantum interference device may comprise at least one superconducting loop, wherein the superconducting loop comprises at least one inductor adapted to couple magnetic flux into the superconducting loop. The superconducting quantum interference device may further comprise at least two Josephson junctions, and, for example may be configured as a DC-SQUID. The at least one inductor may be shunted by a resistor and/or by the at least one Josephson junction, which is configured to act as a variable inductor. The at least one Josephson junction may comprises a single Josephson junction which directly shunts the at least one inductor, and thus be configured, for example, as a bi-SQUID. The operating parameters of the single Josephson junction and superconducting quantum interference device may be together selected to increase the linearity of the linear detector output.

The at least one Josephson junction may comprise at least two additional superconducting loops, each comprising at least one inductor and at least two Josephson junctions, whereby each of the inductors is adapted to couple magnetic flux into its respective superconducting loop, and each superconducting loop has a respective loop output, the respective loop outputs and the superconducting quantum interference device output being combined to provide the linear device output. The linear device output may receive contributions from the respective loop outputs of the at least two additional superconducting loops in parallel and/or in series with the superconducting quantum interference device output. The at least two additional superconducting loops may be substantially magnetically shielded by a superconducting ground plane. The magnetic field may be coupled to the at least two additional superconducting loops by inductive coupling from a superconducting control line.

A power of the detector output may be at least 6 dB higher than a power of the magnetic field. Thus, the detector may serve as an amplifier. The applied magnetic field may comprise a radio-frequency magnetic signal, the detector further comprising an active antenna element having a power gain of at least 3 dB, configured to receive a radio frequency signal and present the radio frequency magnetic signal corresponding to the radio frequency signal.

The superconducting quantum interference device may comprise an inductor and at least two Josephson junctions, and wherein the at least one Josephson junction comprises an additional superconducting loop, comprising at least one inductor and at least two Josephson junctions having an additional output, wherein the linear detector output comprises a differential output of the device output and the additional output. The device output of the superconducting quantum interference device and the additional superconducting quantum interference device are typically each periodic in the magnetic field, and according to one embodiment a respective magnetic flux input to the inductors of the superconducting quantum interference device and the additional superconducting loop are offset equivalent to about one-half of the periodicity in the device output.

The at least one Josephson junction may be configured as part of at least one additional superconducting quantum interference device each having a respective additional superconducting quantum interference device output, the at least one additional superconducting quantum interference device exhibiting a substantially different periodicity in its respective device output with respect to magnetic field than the superconducting quantum interference device. The superconducting quantum interference device output and the at least one respective additional superconducting quantum interference device output may be connected in series, and the detector output is substantially linear with respect to changes in magnetic field over a range of magnetic fields outside of a null field, for which neither the superconducting quantum interference device nor the at least one respective additional superconducting quantum interference device is more linear.

The detector may be configured to provide two identical arrays, each array comprising at least four superconducting quantum interference devices, one of the at least four superconducting quantum interference devices being the superconducting quantum interference device, each superconducting quantum interference device having a superconducting loop with a coupling inductance and at least two Josephson junctions, the array having a device output that is periodic in the magnetic field input, and substantially linear in magnetic field over a substantial portion of a quadrant of the field periodicity, connected to provide at least two of the at least four superconducting quantum interference devices respectively in parallel, and at least two of the at least four superconducting quantum interference devices respectively in series, each of the identical arrays being provided with a relative magnetic field offset of one-half of the field periodicity with respect to the other; with the detector output representing a differential output from the outputs of the two identical arrays. A coupling inductance of at least one superconducting quantum interference devices may be shunted by a linear resistance. A coupling inductance of at least one superconducting quantum interference devices may be shunted by a variable inductor device with an inductance selected to generate a substantially linear periodic field dependence within a quadrant of the field periodicity. The variable inductor device may comprise the at least one Josephson junction. A radio frequency signal may be inductively coupled to the two identical arrays. A magnetic loop antenna structure may be available to provide the radio frequency signal.

BRIEF DESCRIPTION OF THE DRAWINGS

The foregoing summary, as well as the following detailed description of the embodiments of the present invention, will be better understood when read in conjunction with the appended drawings. For the purpose of illustrating the invention, there are shown in the drawings embodiments which include those presently preferred. As should be understood, however, the invention is not limited to the precise arrangements and instrumentalities shown.

FIG. 1 shows basic SQUID structures of the prior art.

FIG. 2 shows an iterative algorithm for successively linearizing the voltage across a serial array of SQUID cells by adjusting the distribution of areas of the cells.

FIG. 3 shows a differential array structure consisting of two series arrays of SQUIDs with current biasing $I_b = I_c$; in one array, each cell is biased by magnetic flux $\Phi_0/2$, and an additional flux bias of $\Phi_0/4$ is applied to all cells to set the operating point.

DETAILED DESCRIPTION OF THE PREFERRED EMBODIMENTS

I. Bi-SQUID

As described above, a major part of the invention comprises a new SQUID cell, the bi-SQUID. The DC SQUID, modified by adding a Josephson junction shunting the loop inductance, provides extremely high linearity with the proper selection of parameters. This is somewhat surprising, since a Josephson junction presents a nonlinear inductance. However, the junction nonlinearity is able to compensate the nonlinearity of the device in order to achieve an improved linearity close to 120 dB for significant loop inductances (which are necessary to achieve large coupling to external signals). It is to be understood by those skilled in the art that any other nonlinear reactance that functions in a similar way would have a similar effect on reducing the nonlinearity of the system transfer function.

Figure 4B:
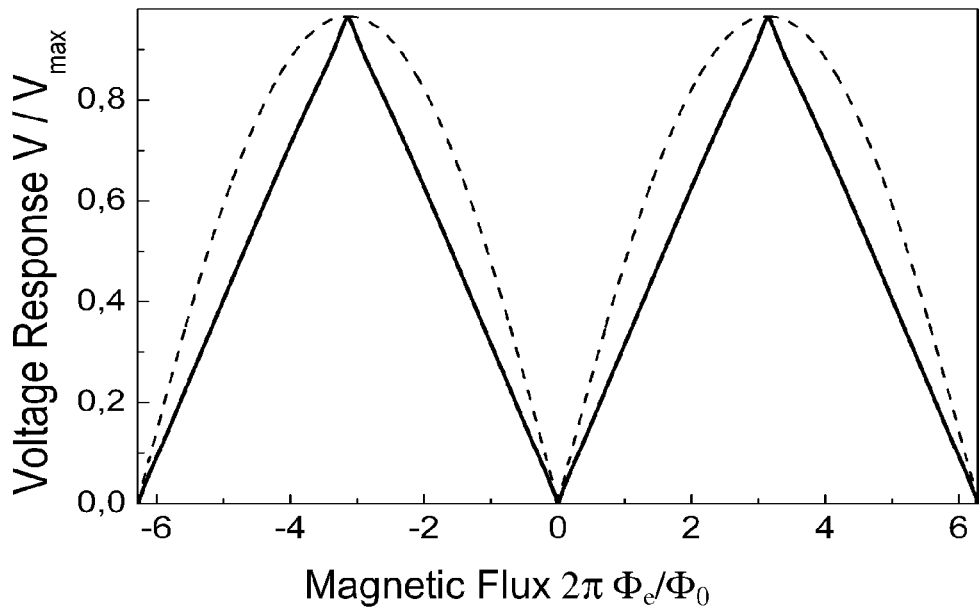
FIG. 4 shows a schematic of a bi-SQUID and its periodic voltage response, as contrasted with that of a conventional SQUID without the shunt junction.
Figure 5:
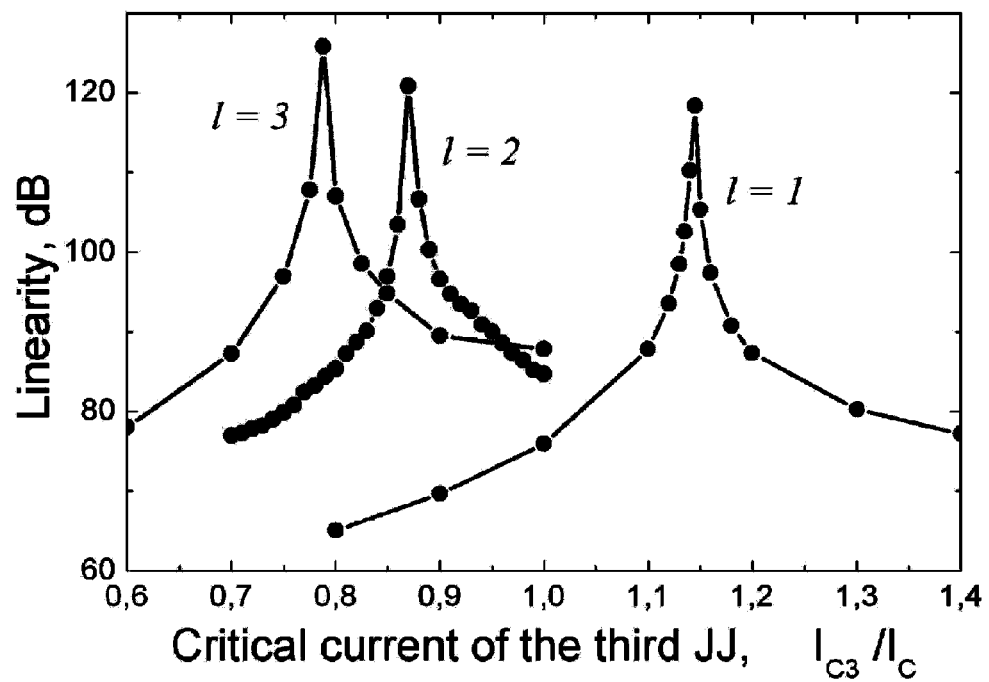
FIG. 5 shows the model dependence of the linearity (in dB) vs. the critical current $I_{c3}$ of the shunt junction for a bi-SQUID, for several values of inductance L.
Figure 6:
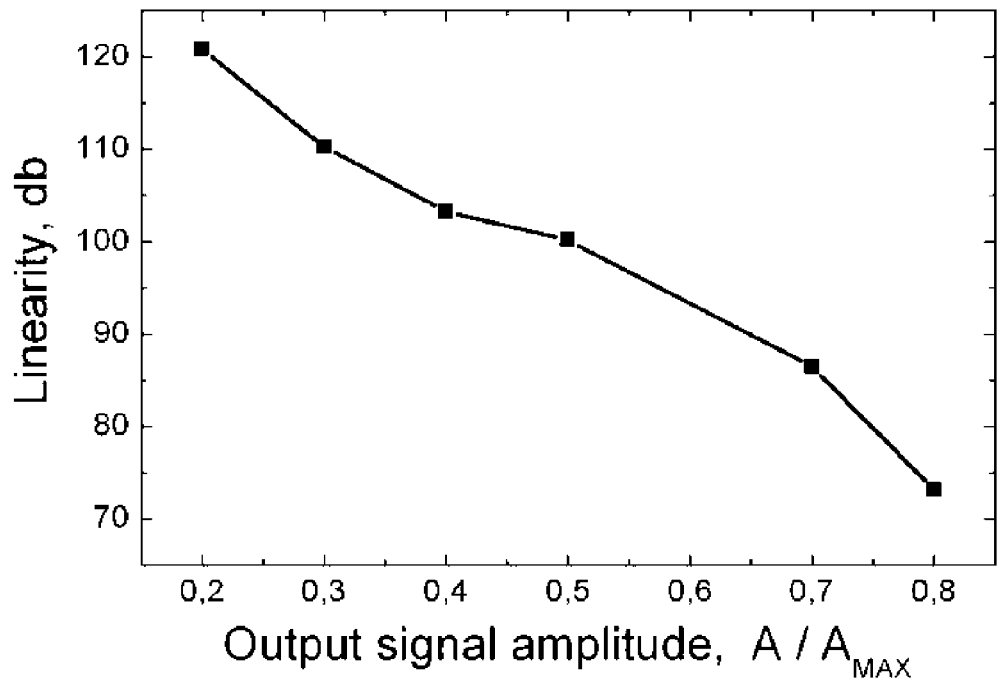
FIG. 6 shows the model dependence of the linearity on the output signal amplitude.

The linearity dependence of the shunt junction $I_{c3}$ on critical current at different inductances of the SQUID loop is shown in FIG. 5. The linearity is calculated using a single-tone sinusoidal flux input (of amplitude $A/A_{max}=0.2$, where $A_{max}$ corresponds to the flux amplitude $\Phi_0/4$), and measuring the total harmonic distortion in dB. This result shows that the linearity is sharply peaked for each value of $l=LI_c/\Phi_0$, but with different optimized values of $I_{c3}$. Very large values of linearity as high as ~120 dB are achievable. FIG. 6 shows how the linearity parameter varies as a function of the signal amplitude for other parameters fixed. The linearity decreases as the signal approaches the maximum value.

A serial array of bi-SQUIDs can be implemented to increase the dynamic range up to a value comparable with the response linearity. Moreover, a serial SQIF providing a single (non-periodic) voltage response with a single triangular dip at zero magnetic flux can be implemented.

Single bi-SQUIDs, serial arrays of bi-SQUIDs, and a prototype of an active electrically small antenna based on a bi-SQUID-array were designed, fabricated and tested, using a 4.5 kA/cm² Nb HYPRES process (Hypres Inc., Elmsford N.Y.). The layout design of the chips with these elements was made before the completion of the numerical simulations aimed at the optimization of the circuit parameters, in particular before obtaining the results presented in FIG. 5 were obtained. Therefore the critical currents of all Josephson junctions in bi-SQUIDs were chosen equal ($I_{c1}=I_{c2}=I_{c3}=I_c$) while the optimal shunt shunting junction critical current should be somewhat less for the implemented inductance parameter $l=1.4$.

Figures 7A, 7B:
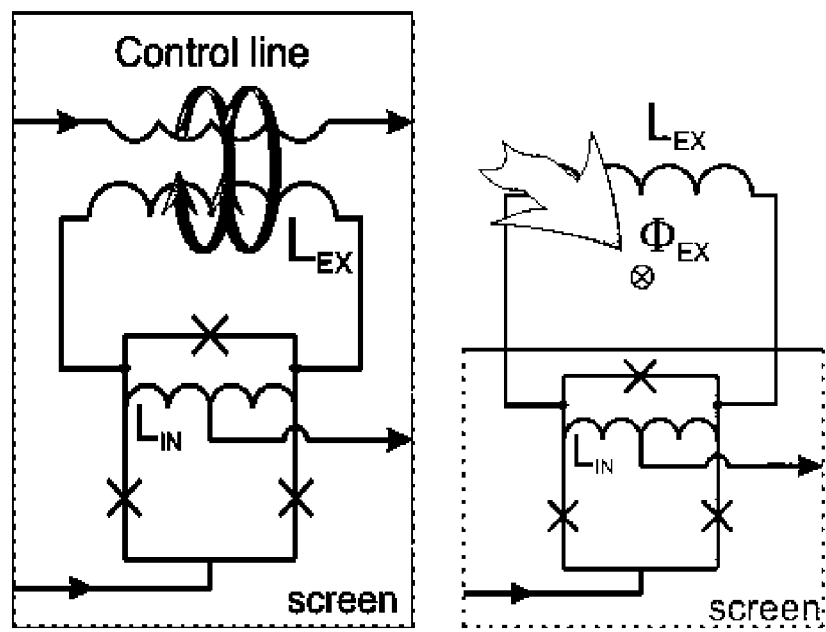
FIG. 7 shows the circuit schematic of a bi-SQUID cell for amplifier and antenna applications.

FIG. 7A shows the schematic equivalent circuit of the bi-SQUID for both the fabricated single bi-SQUID and the serial array of bi-SQUIDs, for amplifier applications. To apply magnetic flux, a control strip line coupled magnetically with an additional transformer loop was used. The coupling loop with high inductance $L_{ex}$ is connected in parallel to inductance $L_{in}$ and therefore practically does not change the interferometer inductance. FIG. 7B shows the corresponding equivalent circuit of the Bi-SQUID for an electrically small antenna.

Figure 8:
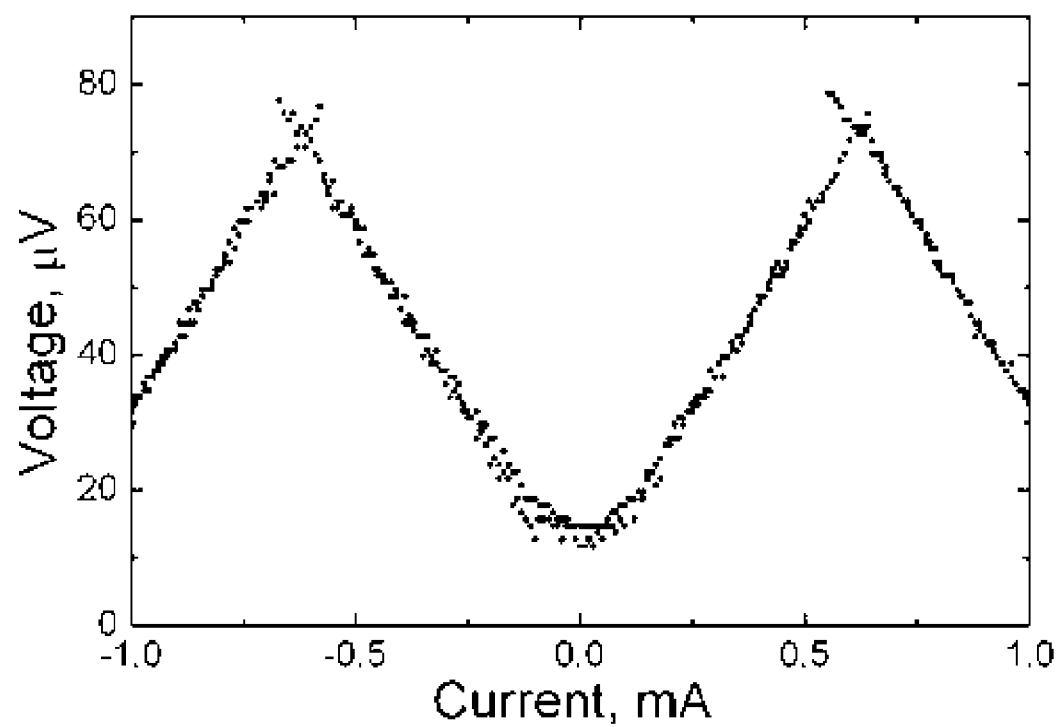
FIG. 8 shows the experimental dependence of voltage on signal current (proportional to flux) for a fabricated bi-SQUID.

The voltage response of the bi-SQUID to applied flux (as measured in current units) is shown in FIG. 8. The applied bias current was slightly more than $2I_c$ for the bi-SQUID. The shunt junction critical current is not optimal at the implemented inductance parameter $l=1.4$. As a result, the observed voltage response is not perfectly linear, although it shows a clear triangular shape. The measured transfer function closely coincides with simulations, however. As for the small hysteresis at the flux value close to $\pm\Phi_0/2$, this indicates that effective inductance parameter of a single-junction SQUID $l^*\equiv l\cdot i_{c3}\equiv 2\pi LI_{c3}/\Phi_0$ is more than 1 and hence the static phase diagram becomes hysteretic.

Figure 9A:
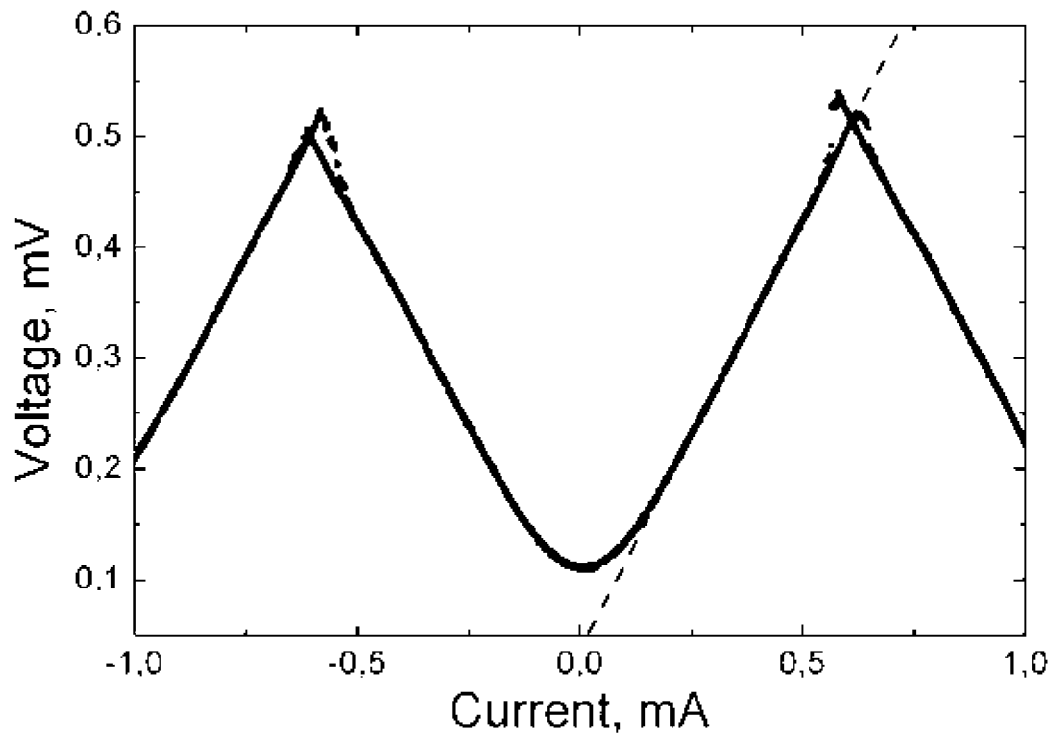
FIG. 9A shows the experimental current dependence of an array of 12 bi-SQUIDs.
Figure 9B:
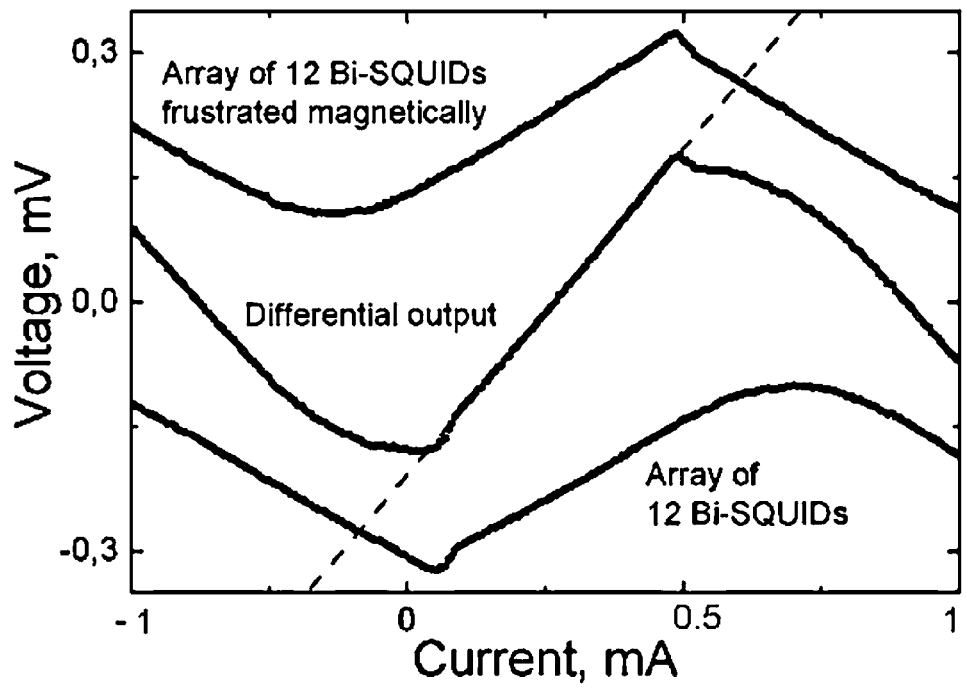
FIG. 9B shows the differential voltage output of two arrays of 12 bi-SQUIDs, with magnetic frustration of $\Phi_0/2$ between the two arrays.

The voltage response of the 12-element bi-SQUID array is presented in FIG. 9A, and looks virtually identical to that for a single bi-SQUID. The applied bias current was slightly more than the critical current of the array. The voltage response linearity of both bi-SQUID and bi-SQUID serial array can be further improved by means of differential connection of two identical bi-SQUIDs or serial arrays oppositely frustrated by half a flux quantum. This improvement results from cancellation of all even harmonics of the individual responses. FIG. 9B shows the voltage response of the differential scheme of two serial arrays of 12 bi-SQUIDs frustrated by half a flux quantum as well as the source responses of the arrays. The arrays are biased about 10% above their critical currents.

II. SQIF-Based Differential Structures

The differential scheme of two parallel SQIFs oppositely frustrated by an applied magnetic field $\delta B$ (see FIG. 3) is able to provide extremely linear voltage response in case of a proper choice of the SQIF structure. In the limit of vanishing inductances l of the interferometer cells, one can use an analytical relation for the parallel SQIF response [3]-[5]:

$$V(B)=V_c\sqrt{(I_b/I_c)^2-|S_K(B)|^2} \quad (5)$$

where $S_K(B)$ is the structure factor:

$$S_K(B) = \frac{1}{K}\sum_{k=1}^{K}\exp\left(i\frac{2\pi}{\Phi_0}B\sum_{m=1}^{k-1}a_m\right), \quad (6)$$

where $I_b$ is the bias current, $I_c$ is the total critical current, K is the number of Josephson junctions, and $a_m$ is the area of the m-th interferometer cell. For sufficiently large K, one can use integration instead of summation, and relation (5) can be transformed as follows:

$$S(B) = \frac{1}{L}\int_0^L dz \cdot \exp\left(i\frac{2\pi}{\Phi_0}B\int_0^z a(x)dx\right). \quad (7)$$

A solution for the specific distribution of the interferometer cell areas a(x) along the SQIF-structure (0<x<L) to make the differential circuit voltage response $$\Delta V(B)=V(B+\delta B)-V(B-\delta B) \quad (8)$$

close to the linear relation $$\Delta V(B)=k\cdot B \quad (9)$$

in a signal region $-\alpha\cdot\delta B<B<\alpha\cdot\delta B$, where $\alpha\le 1$ is sought.

Relations (5)-(9) allow derivation of master equations and minimizing the resulting functional to obtain an optimal distribution a(x). One can use an iterative algorithm to find the problem solution, starting from some initial approximation (see FIG. 2). In the case of finite inductances l of the interferometer cells, the SQIF response V(B) has to be calculated by means of numerical simulation, using in particular the well known software PSCAN [18].

The problem can have more than one solution. Various analytical approximations for the problem solution at l=0 are found; the best one is as follows:

$$a(x)/a_\Sigma=1.2-0.48\sin^3(\pi x), \quad (10)$$

where $a_\Sigma$–total area of the parallel SQIF.

Figure 10A:
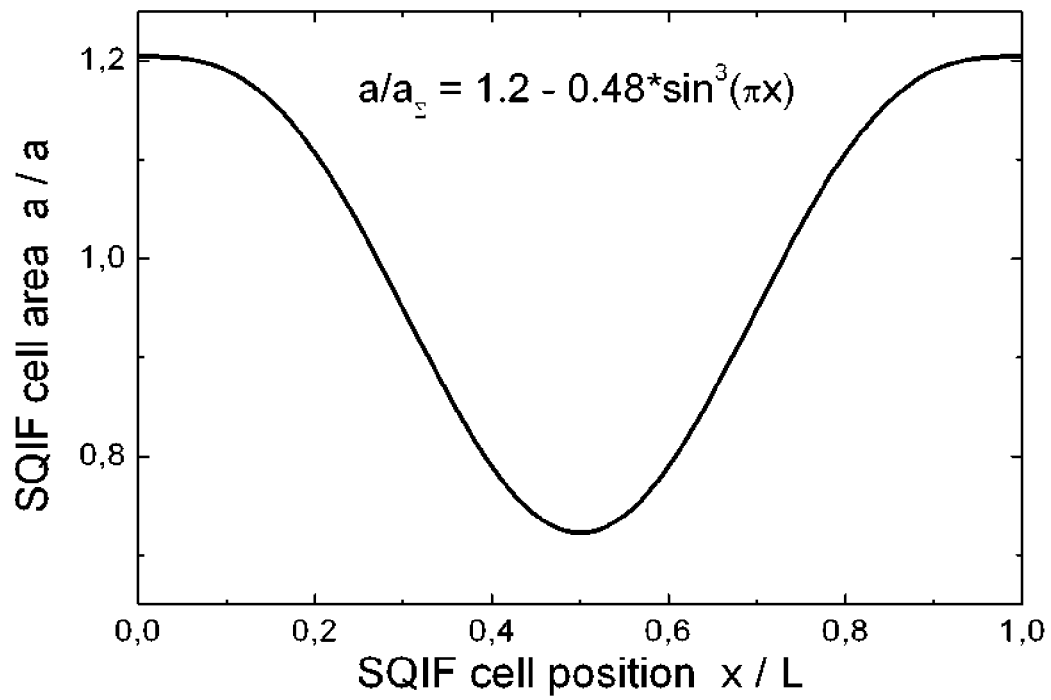
FIG. 10A shows the found optimal distribution of the cell areas along a parallel SQIF.
Figure 10B:
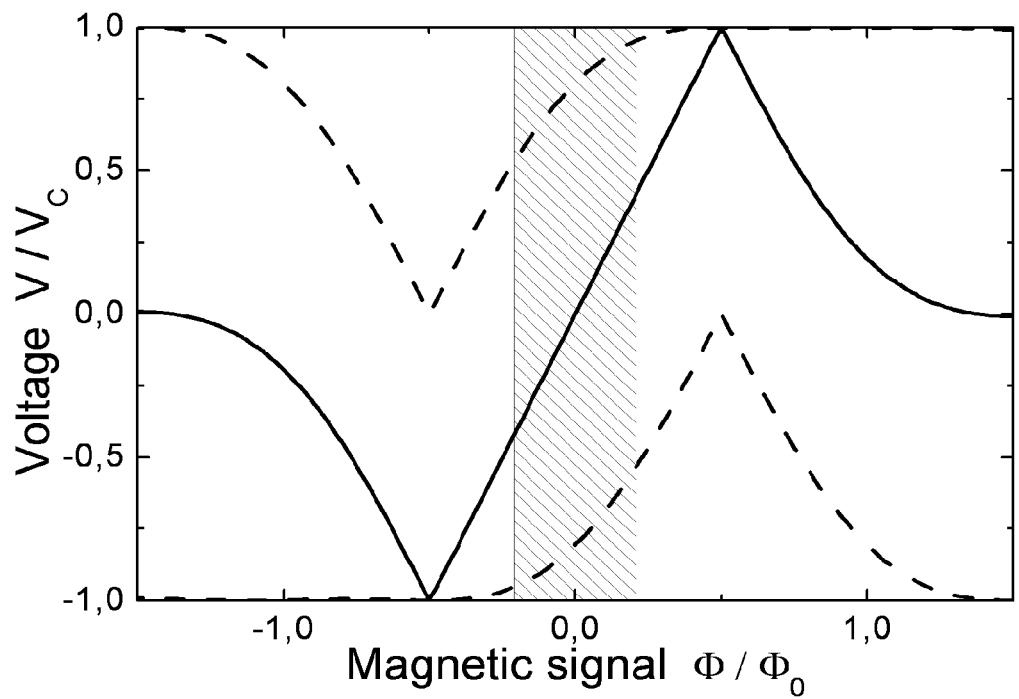
FIG. 10B shows the Voltage response (solid line) of the differential circuit of two parallel SQIFs with the found cell area distribution at optimal magnetic frustration, in which the response linearity within the shaded central area is as high as 101 db, and the frustrated SQIF responses are shown by dashed lines.
Figure 11A:
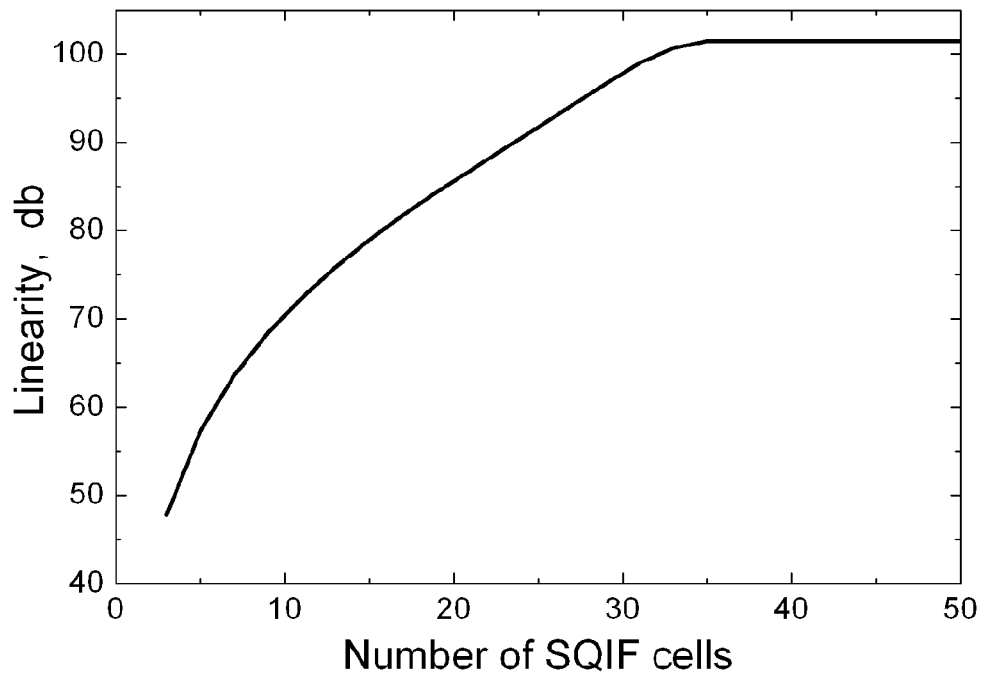
FIGS. 11A and 11B show the linearity of the differential voltage response versus both the number N of SQIF cells (FIG. 11A) and the spread in the cell areas at N=36 (FIG. 11B).
Figure 11B:
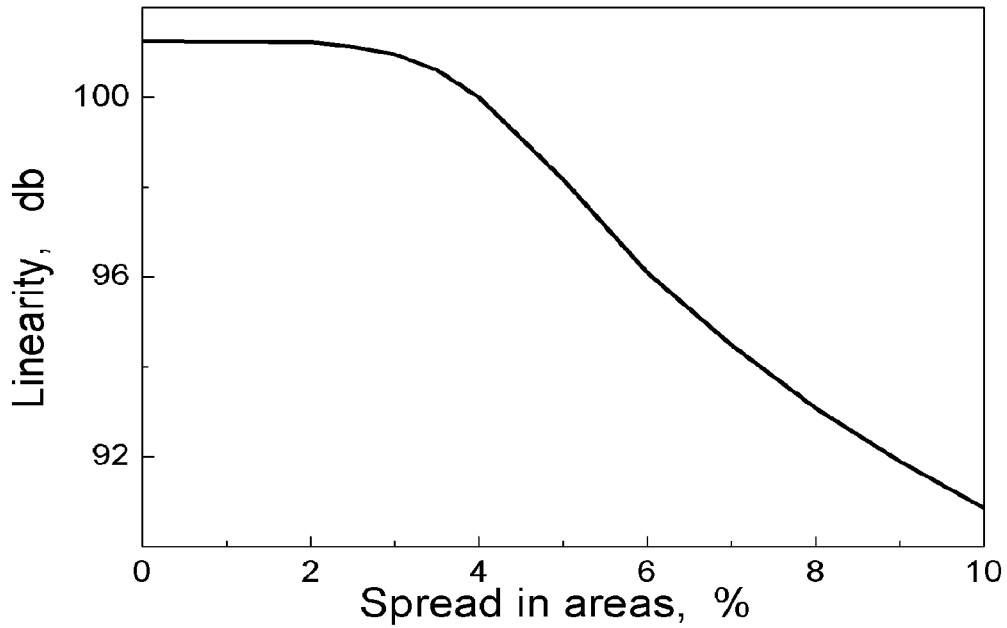

FIGS. 10A and 10B show both the cell area distribution (FIG. 10A) (10) and the differential circuit voltage response (FIG. 10B). Linearity of the voltage response within the shaded central area is as high as 101 dB. To estimate the linearity a sin-like input signal was applied, and the spectrum of the output signal then studied. A ratio of the basic harmonic to the maximal higher one was used to characterize the response linearity. It was found that a very high linearity can be obtained using a relatively small number N of SQIF cells with areas fitted to (10). FIG. 11A shows that the linearity increases rapidly with the number N and at N>35 reaches a plateau where the linearity is as high as 101 dB. As for the impact of technological spread in the cell areas, FIG. 11B shows that the tolerable spread is about 4% at N=36; and then the linearity decreases with the spread value. Approximately the same result was obtained for the spread in critical currents of Josephson junctions. A further increase of N can be used to decrease the impact of the technological spread in the SQIF circuit parameters as well as to increase the dynamic range proportional to $\sqrt{N}$ up to the linearity level obtained.

Figure 12:
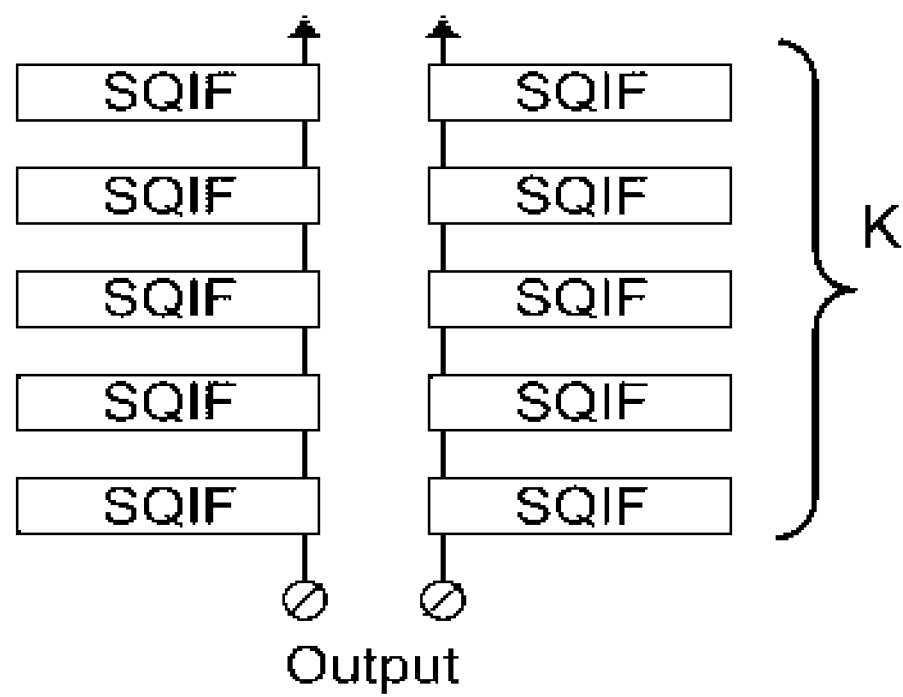
FIG. 12 shows a two-dimensional differential serial-parallel SQIF structure.

Both the dynamic range and the output signal amplitude can be additionally increased by connection of the differential SQIF structures in series, i.e., by providing a two-dimensional differential serial-parallel SQIF structure (see FIG. 12). The number K of the elements connected in series is responsible for the output signal amplitude, while the total number of Josephson junctions $N^*=N \cdot K$ is responsible for the dynamic range of the structure. By varying the number of elements connected in parallel (N) and in series (K), one can change the impedance of the structure over a wide range.

III. Effects of Real Junctions and Coupling Inductances

At the same time, there are several problems which should be solved to realize the potentially high performance of the amplifier or antenna. First of all, one should note that the optimal specific structure of the parallel SQIF reported in [5] was determined based on the ideal RSJ model of Josephson junctions and for the case of vanishing coupling inductances (L=0). Deviations of junctions and inductors from ideal theoretical behavior will hinder the linearity of the real structure fabricated. There are two general approaches to the problem solution: (i) to provide the closest approach of the experimental Josephson-junction characteristics to the ones given by the RSJ model and (ii) to synthesize an optimal SQIF structure founded in experimental Josephson-junction characteristics by means of numerical simulation technique (for example by software PSCAN [18]) and an iterative algorithm (FIG. 2). Indeed, an optimal strategy may be based on a combination of schemes.

In particular, as for the coupling inductance L, the negative influence of the finite value of L on the voltage response linearity can be reduced by shunting resistors $R_{SH}$ connected in parallel to the inductances. Due to the fact that the impedance of the RL circuit becomes low enough at the Josephson oscillation frequency, the parallel array voltage response approaches that for smaller and smaller inductance with the decrease of $R_{SH}$ down to some optimal resistance value depending on the normalized inductance l; further increase in $R_{SH}$ leads to some other linearity distortions. Therefore, the most effective method is synthesis of an optimal SQIF structure with the cell area distribution a(x) optimized for the finite value of l. In this case one should use a high performance numerical simulation technique (e.g., PSCAN software [18]) for calculation of the SQIF voltage response $V(\Phi)$ in every cycle of the iterative algorithm (FIG. 2), which has to be used to solve the master equation.

Figure 13A:
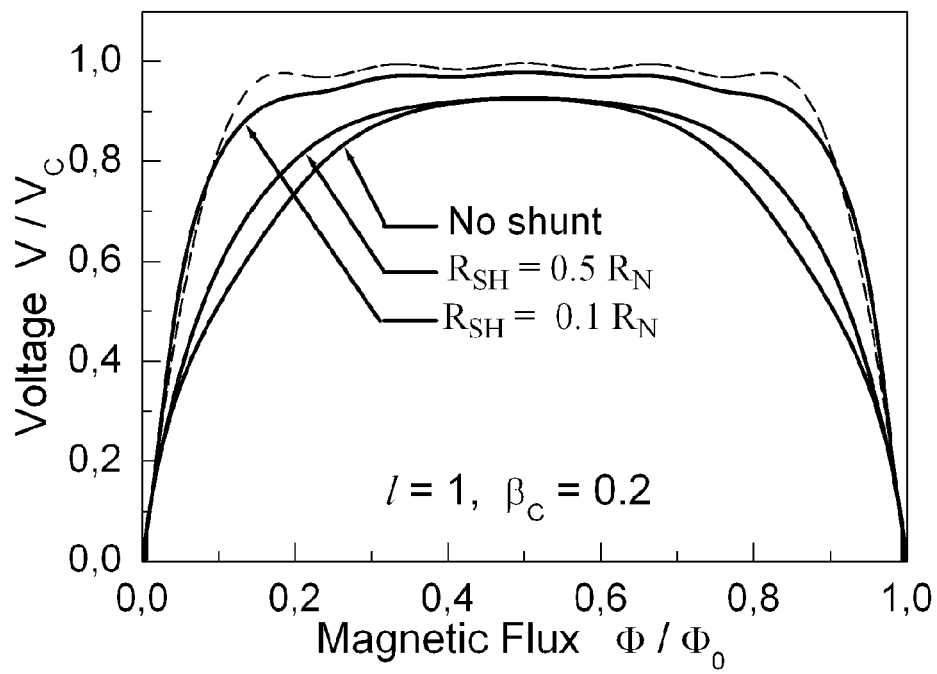
FIG. 13A shows the voltage response of a parallel array of N=6 junctions coupled by inductances with normalized value l=1 at different shunting resistors $R_{sh}$ connected in parallel to the coupling inductances, in which the dashed line shows the voltage response of the array in the limit of small coupling inductance.
Figure 13B:
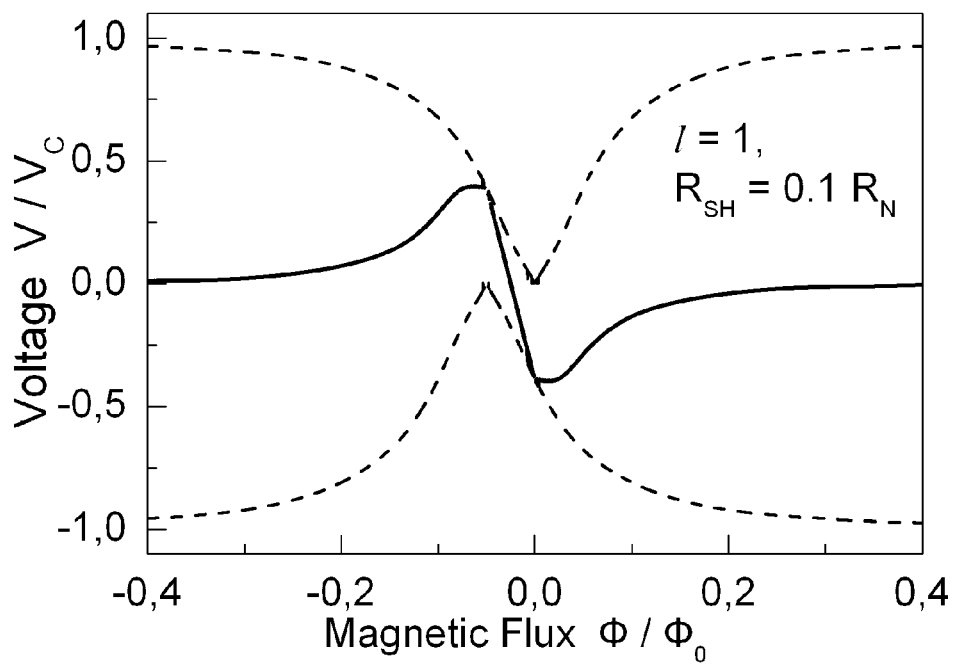
FIG. 13B shows the voltage response of the differential circuit of two frustrated parallel arrays of N=6 Josephson junctions at l=1 and $R_{sh} = R_N$, where $R_N$ is the Josephson junction normal resistance.

The shunting technique efficiency is confirmed by results of numerical simulations presented in FIGS. 13A and 13B. One can see that at $R_{SH} \approx 0.1 R_N$ (where $R_N$ is Josephson junction normal resistance), the voltage response of the parallel array of 6 junctions with $l \equiv 2\pi I_C L/\Phi_0 = 1$ approaches that for vanishing coupling inductances. As a consequence, the required linear voltage response of the differential scheme of two parallel SQIFs with N=20 and coupling inductances l=1 each shunted by resistor $R_{SH} = 0.1 R_N$ are observed.

IV. Advantages of SQIF-Like Structures

In the case of a serial SQIF including N DC SQUIDs, the thermal noise voltage $V_F$ across the serial structure is proportional to square root of N, while the voltage response amplitude $V_{max}(\Phi)$ and the transfer factor $B=\partial V/\partial \Phi$ both are about proportional to $N^{1/2}$. This means that the dynamic range $D=V_{max}(\Phi)/V_F$ increases as $N^{1/2}$. As for the parallel SQIF, in the case of vanishing coupling inductances (l=0), the dynamic range is also proportional to square root of number of junctions N. In fact, the thermal noise voltage $V_F$ across the parallel structure decreases with the square root of N, while the voltage response amplitude $V_{max}(\Phi)$ remains constant and the transfer factor $B=\partial V/\partial \Phi$ increases as about N.

A SQIF-like structure is characterized by a superior broadband frequency response from DC up to approximately $0.1 \cdot \omega_c$, where $\omega_c$ is characteristic Josephson frequency [13]. Therefore, a further increase in characteristic voltage $V_c$ of Josephson junctions by implementation in niobium technology with higher critical current density, or by use of high-$T_c$ superconductors, promises an extension of the frequency band up to several tens of gigahertz. Moreover, the SQIF eliminates high interference, and it sufficiently decreases the well known saturation problem of SQUID-based systems. Therefore, SQIF-based systems can easily operate in a normal lab environment.

An approach to synthesis of multi-SQUID serial structures has been reported, capable of providing periodic high linearity voltage response [11, 12]. The approach is based on the formation of serial structures which are capable of providing periodic triangular voltage response to a magnetic field B. Using interferometer cells with a harmonic voltage response, one can synthesize a serial array consisting of many groups of identical interferometers, each group providing a specific spectral component of the resulting voltage response of the array. According to estimations, the response linearity reaches 120 dB, if the number of the groups is as high as about 165. The second way to synthesize a highly linearity array structure is through implementation of a differential scheme of two serial arrays of DC interferometers biased by current $I_b = I_C$ (critical current biasing), where $I_C$ is the interferometer critical current.

According to an embodiment, a more advanced system is provided comprising one- and two-dimensional multi-element structures characterized by SQIF-like high linearity voltage response. The structures are based on use of a differential scheme of two magnetically frustrated parallel SQIFs, with both a specific cell area distribution a(x) along array and a critical current biasing (see FIG. 3). Optimization of the cell area distribution allows an increase of the voltage response linearity up to the levels required. This optimization can be performed numerically by solution of a master equation with the aid of an iterative algorithm.

A multi-element structure synthesized according to the present embodiments can be used, for example, to provide high performance amplifiers. The proposed two-dimensional structure can also used as an active antenna device. The efficiency of the antenna can be significantly increased by combining it with a reflecting parabolic antenna. By varying the number of elements connected in parallel (N) and in series (K), one can set the impedance to a value needed to optimally match the antenna load used.

The high expectation for the multi-element SQIF-like structures is based on estimations based on idealized structures, as well as on the voltage response characteristics calculated with use of RSJ model. However, the true characteristics of the actually realized array structures may be different. Limitations imposed by finite coupling inductances and stray capacitances are discussed below.

The finite value of coupling inductances l between Josephson junctions in a parallel array is of importance for all principal characteristics of the array, because of limitations on the coupling radius.

The finite coupling radius limits an increase of both the dynamic range and the transfer factor $dV/d\Phi$ with increase of number of junctions N. To study the noise characteristics in a clearer and more powerful manner, one can perform numerical simulation of a parallel array of the inductively coupled resistors $R_N$, each connected to an individual source of white-noise current.

Figure 14:
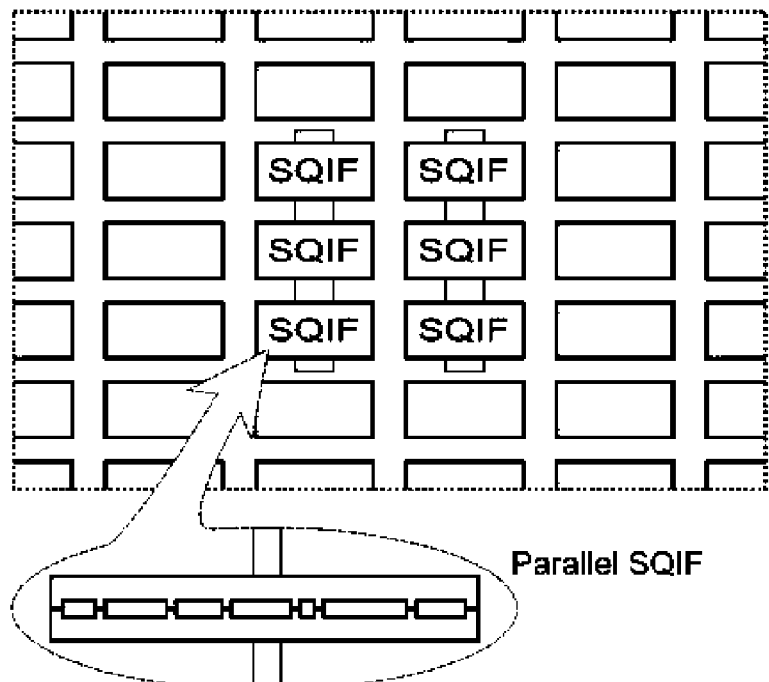
FIG. 14 shows an active electrically small antenna based on a two-dimensional differential serial-parallel SQIF-structure.

FIG. 14 shows an active electrically small antenna based on two-dimensional differential serial-parallel SQIF-structure (the filled structure in central part of chip). SQIF sections are connected by strips of normal metal. The chip contains a regular matrix of identical blocks of parallel SQIFs, to provide a homogeneous magnetic field distribution in the center part of the chip. The inset shows such a block with a parallel SQIF. The shown SQIF is topology-oriented for a high-Tc superconductor technology.

Figure 15:
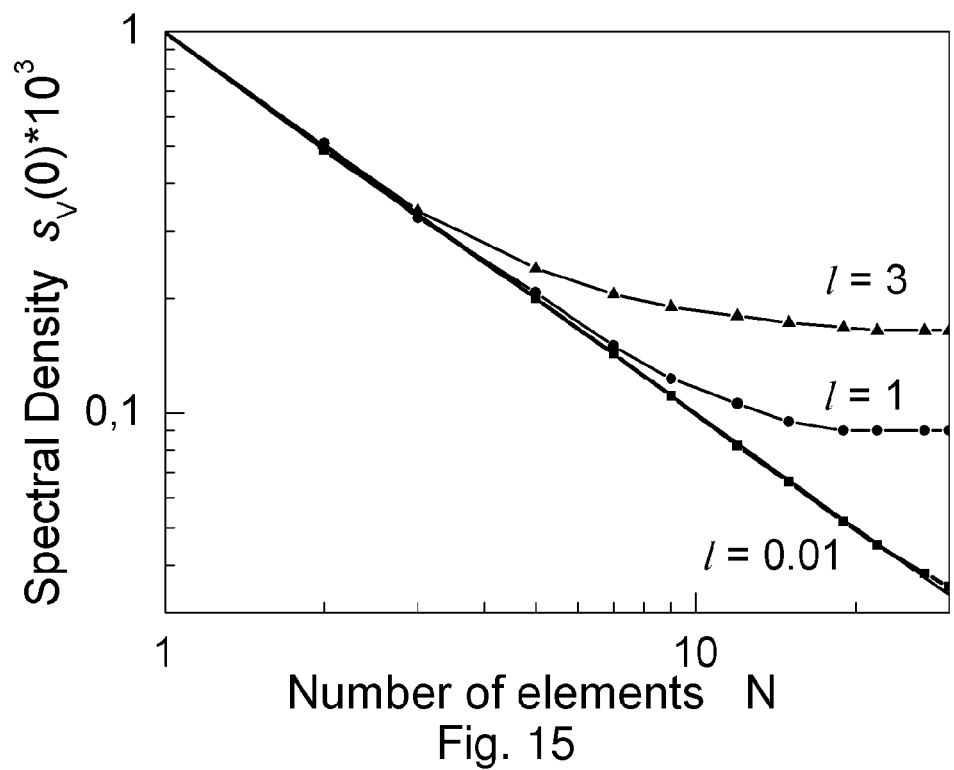
FIG. 15 shows the dependence of the normalized low-frequency spectral density of the resistor voltage noise on number N of resistors $R_N$ connected in parallel by coupling inductances at different normalized values l of the inductances.

FIG. 15 shows the dependence of the low-frequency spectral density $S_v(0)$ of the resistor voltage noise on the number of resistors N at different values of normalized coupling inductance l. The data are presented for normalized frequency $\omega/\omega_c=10^{-3}$ corresponding closely to the signal frequency range in a SQUID/SQIF amplifier (here $\omega_c$ is characteristic Josephson frequency). Within the coupling radius, the spectral density $S_v(0)$ decreases as 1/N and then it comes to a constant value when number N becomes more than coupling radius depending on l.

Figure 16:
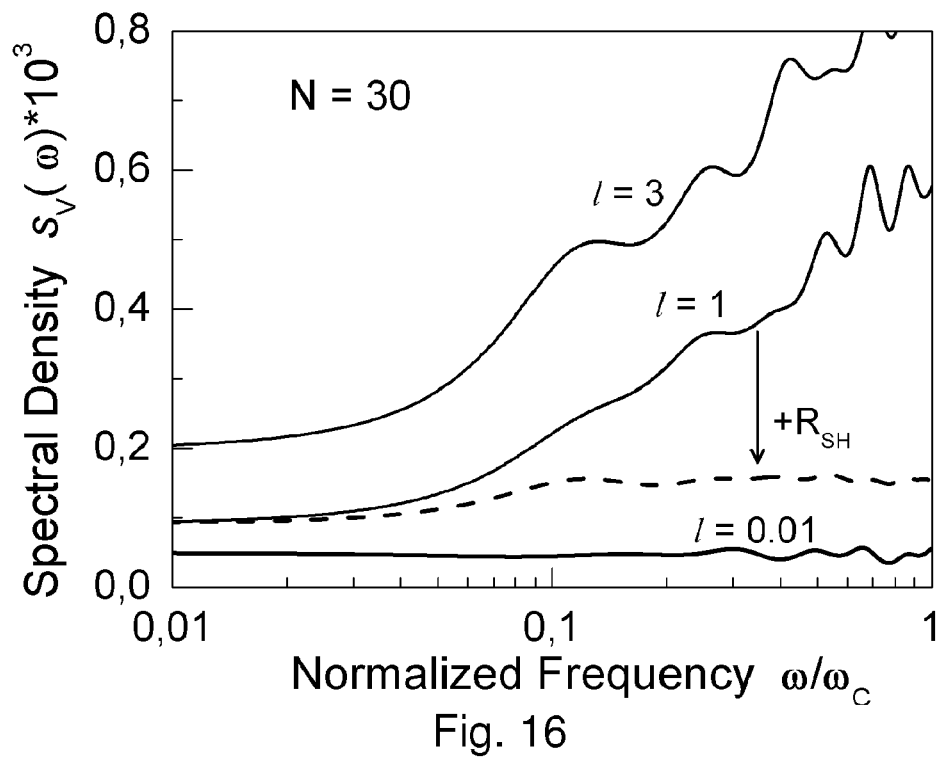
FIG. 16 shows the dependence of the normalized spectral density of the resistor voltage noise in a parallel array of 30 resistors $R_N$ on normalized frequency at different normalized values l of the coupling inductances.

FIG. 16 shows the spectral density $S_v(\omega)$ versus normalized frequency ranged from 0.01 to 1 for parallel array of 30 resistors $R_N$. At both coupling inductances l=3 and l=1, the spectral density $S_v(\omega)$ monotonically increases with frequency and remains constant at l=0.001. It reflects a decrease in coupling radius with frequency for both inductances l=3 and l=1, as well as the fact that the coupling radius at l=0.01 exceeds the size of the array of 30 elements in the entire frequency range.

One can see that implementation of noiseless resistors $R_{SH}=0.1R_N$ shunting the inductances l=1 stops both the coupling radius decrease and the noise spectral density increase at $\omega/\omega_c\geq 0.1$ (see dashed line in FIG. 16). A proper account of the respective noises of the shunting resistors will lift the curve about two times as high, as if the spectral density for the noise current sources connected to basic resistors $R_N$ becomes more by factor k≈4-5.

Figure 17:
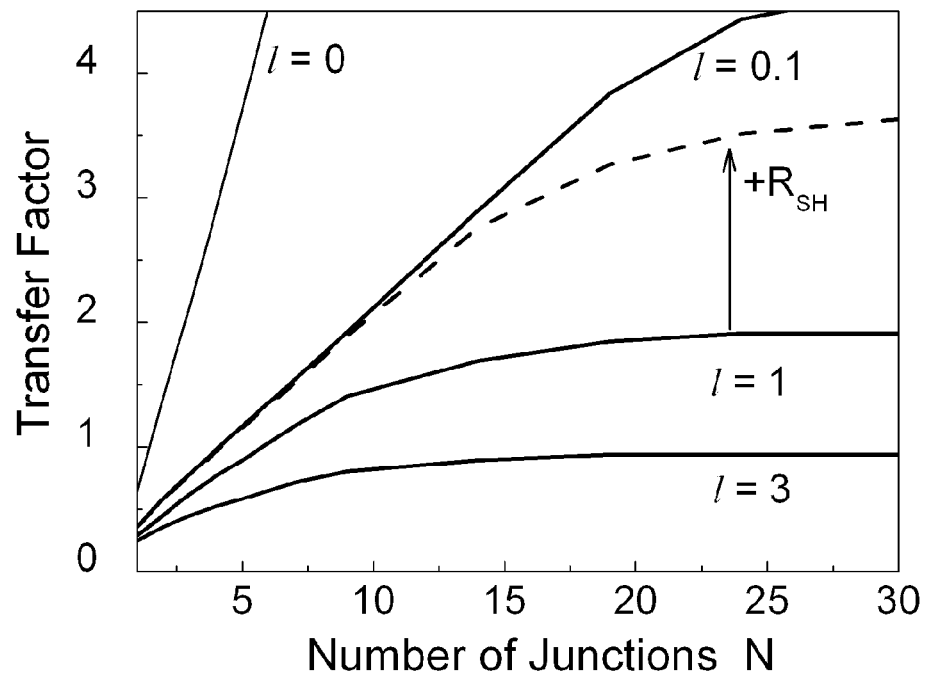
FIG. 17 shows a normalized transfer factor $B = dV/d\Phi$ for a parallel array of Josephson junctions versus number of junctions N at different normalized values l of coupling inductances.

FIG. 17 shows the dependence of the normalized transfer factor B=dV/dΦ for a parallel array of Josephson junctions versus number of junctions N at different normalized values l of coupling inductances. The dashed curve shows the transfer factor dependence for l=1 when all the coupling inductances are shunted by resistors $R_{SH}=R_N$. The observed saturation in the transfer factor, depending on N, is reached when number of junctions exceeds the coupling radius at frequency $\omega/\omega_c \sim 1$.

Figure 18:
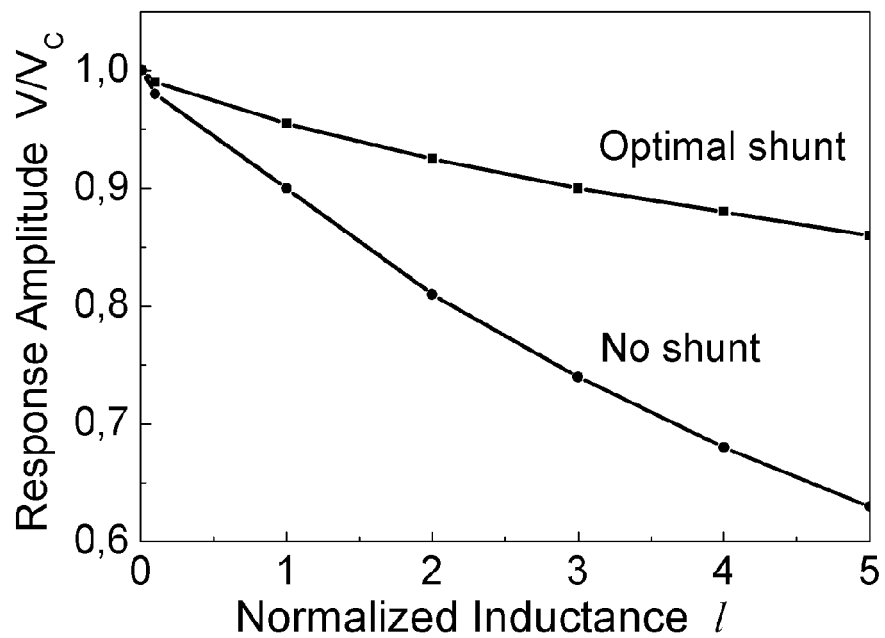
FIG. 18 shows the normalized voltage response amplitude $V_{max}$ for two parallel arrays of Josephson junctions coupled correspondingly by unshunted inductances (lower curve) and by the optimally shunted inductances (upper curve) versus normalized inductance value.

In such a way, increases in dynamic range $D=V_{max}(\Phi)/V_F$ with the number N of Josephson junctions in a parallel array are limited by the coupling radius at finite coupling inductances. Shunting of the inductances for improving linearity of the differential SQIF voltage response does not really change the dynamic range. In fact, the observed increase in the voltage response amplitude $V_{max}(\Phi)$ (see FIG. 18) is compensated by an increase in $V_F$ owing to the noise of the shunts.

In the case of an unloaded serial array of DC SQUIDs, the dynamic range does actually increase with the number N of interferometer cells. Nevertheless, in reality, stray capacitances and load impedance are both able to substantially change the I-V curve of the array, and hence the amplitude $V_{max}$ and form of the array voltage response. The decrease in $V_{max}$ leads to a proportional decrease in dynamic range. The change in the voltage response curve reduces linearity of the whole array structure.

Figure 19A:
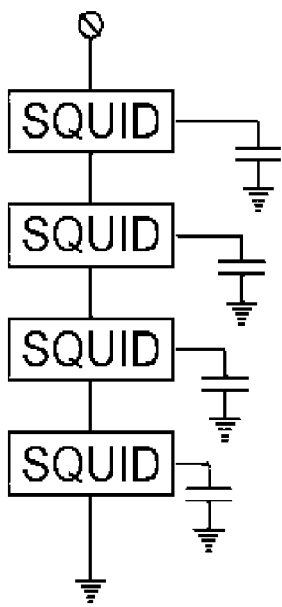
FIG. 19A shows a serial array with stray capacitances and typical I-V curves of a serial array of 10 DC SQUIDs calculated using the RSJ model in the presence of stray capacitances and without capacitances.
Figure 19B:
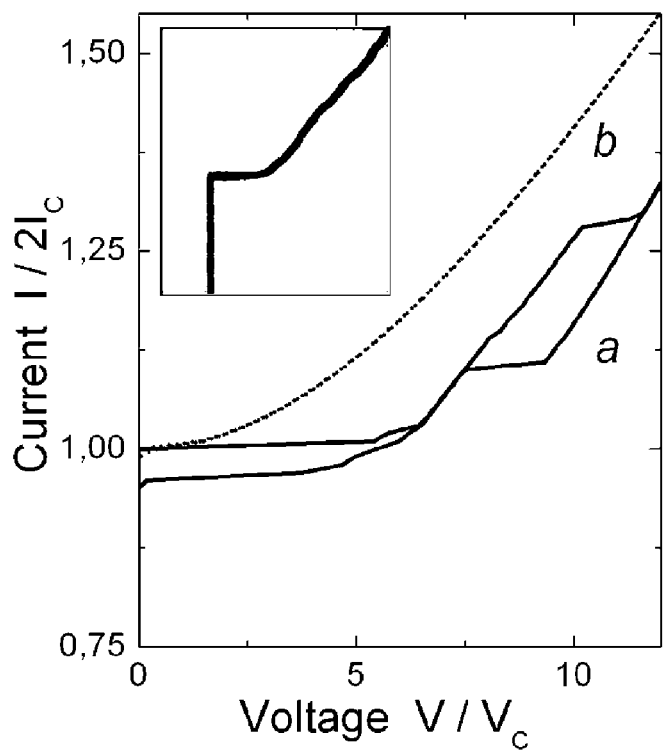
FIG. 19B shows the experimentally measured I-V curve of a serial array of 20 SQUIDs fabricated using standard niobium integrated circuit technology.

FIGS. 19A and 19B shows the typical impact of the stray capacitances on I-V curve of the serial array of DC SQUIDs. The contribution of the stray capacitance of each SQUID increases with the SQUID position from ground to signal terminal. Stray capacitances cause the I-V curve to appear similar to a hysteresis curve, as well as to form one or even more undesired features on the I-V curve. The features shown result from a phase-locking phenomenon. In the solid line labeled a of FIG. 19B, the features of the I-V curves of the array cells do not coincide because of different "capacitive loads." In the dashed line labeled b, the features of all the individual I-V curves coincide because of mutual phase-locking of the Josephson-junction oscillations.

Figure 20A:
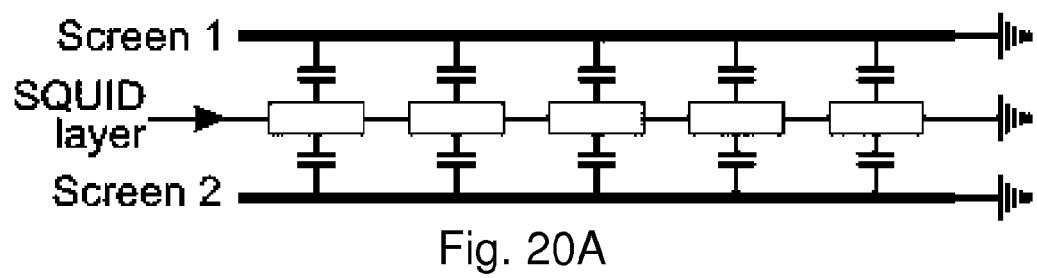
FIG. 20A shows a schematic of a system subject to stray capacitances in the SQUID array structures fabricated using standard niobium technology with two screens (upper and lower screens) in the case of a continuous double screen.
Figure 20B:
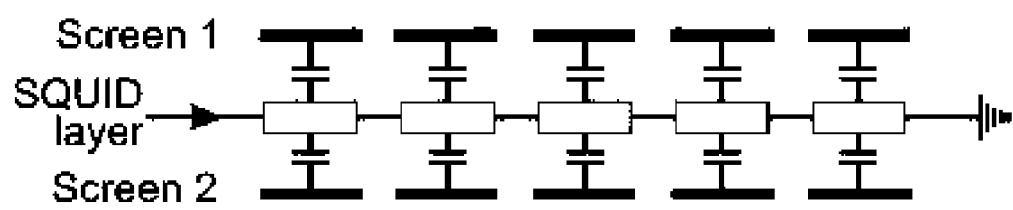
FIG. 20B shows a schematic of a first system which reduces stray capacitances in the SQUID array structures fabricated using standard niobium technology with two screens (upper and lower screens) in the case of an individual double screen.
Figure 20C:
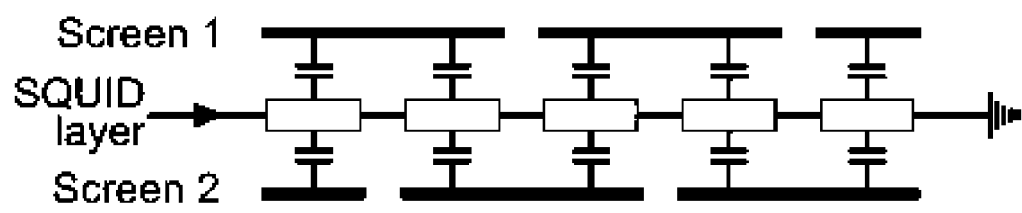
FIG. 20C shows a schematic of a second system which reduces stray capacitances in the SQUID array structures fabricated using standard niobium technology with two screens (upper and lower screens) in the case of an intermittent (dashed) double screen.

The fabrication of serial arrays based on standard niobium technology using two superconducting screens is accompanied by undesirably high stray capacitances (see FIG. 20A). To essentially decrease the impact of the capacitance, individual double screening may be used for each SQUID as shown in FIG. 20B and FIG. 20C. Both schemes are characterized by the I-V curve b in FIG. 13B, but the latter one provides lower inductances of the strips which connect the SQUID cells.

V. Conclusion

Advantages of one- and two-dimensional SQIF-like structures for microwave applications as high-performance amplifying devices are readily apparent from their ability to provide an increase in dynamic range with a number of elements as well as high linearity when employing a properly specified array structure. Linearity can be especially enhanced using cells comprising the bi-SQUID structure. At the same time, there are some fundamental limitations imposed by finite coupling inductances, stray capacitances and parasitic couplings. Therefore, implementation of high-performance devices preferably employs careful and detailed analysis of the multi-element array structure, taking into consideration all the true parameters including all parasitic parameters and couplings. A differential scheme comprising two magnetically frustrated parallel SQIFs is developed to obtain a highly linear single-peak voltage response. The response linearity can be increased up to 120 dB by means of a set of properly specified cell area distribution of the SQIFs. The high linearity is attainable with a relatively small number of junctions. Such a circuit provides a high-performance two-dimensional serial-parallel SQIF-like array. Varying the number of elements connected in parallel, and in series, permits setting the impedance value needed to solve the problem related to negative impact of the load used. The synthesized structures can be used to design high-efficiency amplifiers and electrically small active antennae for use in the gigahertz frequency range. The efficiency of the antenna can be significantly increased by combination with a reflecting parabolic antenna.

It should be appreciated that changes could be made to the embodiments described above without departing from the inventive concepts thereof. It should be understood, therefore, that this invention is not limited to the particular embodiments disclosed, but it is intended to cover modifications within the spirit and scope of the present invention as defined by the appended claims.

REFERENCES

Each of the following is expressly incorporated herein by reference:

[1] V. K. Kornev, I. I. Soloviev, N. V. Klenov, and O. A. Mukhanov, "Synthesis of High Linearity Array Structures," *Superconducting Science and Technology (SUST)*, vol. 20, 2007, p. S362-S366.

[2] V. K. Kornev, I. I. Soloviev, N. V. Klenov, and O. A. Mukhanov, "High linearity Josephson-junction array structures," *Physica C*, vol. 468, 2008, p. 813-816.

[3] J. Oppenlaender, Ch. Haeussler, and N. Schopohl, "Non-$\Phi_0$-periodic macroscopic quantum interference in one-dimensional parallel Josephson junction arrays with unconventional grating structure", *Phys. Rev. B*, Vol. 63, 2001, p. 024511-1-9.

[4] V. Schultze, R. I. Isselsteijn, H.-G. Meyer, J. Oppenländer, Ch. Häussler, and N. Schopohl, "High-$T_c$ superconducting quantum interference filters for sensitive magnetometers," *IEEE Trans. Appl. Supercond.*, v. 13, No. 2, p. 775-778 (2003).

[5] V. K. Kornev, I. I. Soloviev, J. Oppenlaender, Ch. Haeussler, N. Schopohl, "Oscillation Linewidth and Noise Characteristics of Parallel SQIF," *Superconductor Science and Technology (SUST)*, Vol. 17, Issue 5, 2004, p. S406-S409.

[6] V. K. Kornev, A. V. Arzumanov, "Numerical Simulation of Josephson-Junction System Dynamics in the Presence of Thermal Noise," *Inst. Physics Conf. Ser.*, No 158, TOP Publishing Ltd, 1997, p. 627-630.

[7] G. V. Prokopenko, S. V. Shitov, I. L. Lapitskaya, S. Kohjiro, M. Maezawa, and A. Shoji, "*Study of multi-Channel RF Amplifier Based on DC SQUID for 3-5 GHz Band*," IEEE Trans. on Applied Superconductivity, vol. 15, No. 2, (2005), p. 741-744.

[8] K. D. Irwin, M. E. Huber, IEEE Trans. Appl. Supercond. AS-11 (2001), 1265.

[9] M. Mueck, "*Increasing the dynamic range of a SQUID amplifier by negative feedback*," Physica C 368 (2002) 141-145.

[10] J. Oppenländer, Ch. Häussler and N. Schopohl, Phys. Rev. B 63, 024511 (2001).

[11] O. A. Mukhanov, V. K. Semenov, D. K. Brock, A. F. Kirichenko, W. Li, S. V. Rylov, J. M. Vogt, T. V. Filippov, Y. A. Polyakov, "*Progress in the development of a superconductive high-resolution ADC*," Extended Abstracts of ISEC '99, Berkeley Calif., p. 13-16, June 1999.

[12] O. A. Mukhanov, V. K. Semenov, W. Li, T. V. Filippov, D. Gupta, A. M. Kadin, D. K. Brock, A. F. Kirichenko, Yu. A. Polyakov, I. V. Vernik, "*A superconductor high-resolution ADC*," IEEE Trans. Appl. Supercond., vol. 11, p. 601-606, March 2001.

[13]. K. Kornev, A. V. Arzumanov, "Numerical Simulation of Josephson-Junction System Dynamics in the Presence of Thermal Noise," *Inst. Physics Conf. Ser.*, No 158, IOP Publishing Ltd, 1997, p. 627-630.

[14] T. V. Filippov, S. Pflyuk, V. K. Semenov, and E. Wikborg, "*Encoders and decimation filters for superconductor oversampling ADCs*," IEEE Trans. Appl. Supercond., vol. 11, p. 545-549, March 2001.

[15] M. Mueck, M.-O. Andre, J. Clarke, J. Gail, C. Heiden, Appl. Phys. Letters, 72 (1998) 2885.

[16] G. V. Prokopenko, S. V. Shitov, I. L. Lapitskaya, V. P. Koshelets, and J. Mygind, *"Dynamic characteristics of S-band dc SQUID amplifier,"* Applied Superconductivity Conf. (ASC'04), Jacksonville Fla., October 2004, report 4EF10.

[17] G. V. Prokopenko, S. V. Shitov, I. V. Borisenko, and J. Mygind, "*A HTS X-band dc SQUID amplifier: modelling and experiment*," Applied Superconductivity Conf. (ASC '04), Jacksonville Fla., October 2004, report 4EF12.

[18] Polonsky S.; Shevchenko P.; Kirichenko A.; Zinoviev D.; Rylyakov A., "*PSCAN96: New software for simulation and optimization of complex RSFQ circuits*", IEEE transactions on applied superconductivity, 1996 Applied Superconductivity Conference. Part III, Pittsburgh, Pa., 1997, vol. 7 (3), no 2 (1517 p.) (9 ref.), pp. 2685-2689.

[19] Kornev, V K, Soloviev. I I, Klenov, N V, Mukhanov, O A, "*Bi-Squid—Novel Linearization Method for dc Squid Voltage Response*", Superconductor Science and Technology (submitted for publication)(copy attached).

What is claimed is:

1. A superconducting radio frequency amplifier, comprising a plurality of Josephson junctions, each having a respective output, wherein a radio frequency input is distributed inductively to each of the plurality of Josephson junctions, and the respective outputs of the plurality of Josephson junctions are combined into a composite signal having a total harmonic distortion for at least one sinusoidal input signal of less than −80 dB.

2. The amplifier of claim 1, wherein the composite signal has a total harmonic distortion for at least one sinusoidal input having a frequency above 1 GHz signal of less than −80 dB, and wherein a power of the composite signal is greater than a power of the radio frequency input.

3. The amplifier of claim 1, whereby the plurality of Josephson junctions are integrated with a plurality of antenna structures, so as to form an active radio frequency antenna receiver array.

4. The amplifier of claim 1, whereby the plurality of Josephson junctions comprise niobium.

5. The amplifier of claim 1, whereby the plurality of Josephson junctions comprise a high-Tc superconductor.

6. The amplifier of claim 1, further comprising at least one superconductor screen configured to reduce a stray capacitance effect.

7. The amplifier of claim 1, wherein the plurality of Josephson junctions are fabricated on a chip using integrated circuit technology.

8. The amplifier of claim 1, wherein the plurality of Josephson junctions comprise a plurality of Superconducting Quantum Interference Devices (SQUIDs) configured in an array.

9. The amplifier of claim 8, wherein the array comprises a plurality of SQUIDs connected in series.

10. The amplifier of claim 9, wherein each SQUID has a loop having a loop area, wherein the distribution of the effective loop areas of the SQUIDs connected in series are defined according to an iterative algorithm which optimizes the linearity of the amplifier output.

11. The amplifier of claim 9, wherein two identical series-connected arrays of SQUIDs are biased in a differential manner so as to cancel out even harmonic distortion in a combined output of the two identical series connected arrays of SQUIDs.

12. The amplifier of claim 1, wherein the plurality of Josephson junctions comprise a plurality of Superconducting Quantum Interference Filters (SQIFs) configured in an array.

13. The amplifier of claim 1, where the plurality of Josephson junctions are configured as at least one Bi-SQUID comprising a SQUID shunted by a Josephson junction with parameters optimized so as to generate a triangle-wave output as a function of linear input.

14. A method of amplifying a radio frequency signal, comprising:
providing a plurality of superconducting components, each exhibiting an intrinsic harmonic distortion, configured in an array so as to present an amplified radio frequency output that compensates the intrinsic harmonic distortion in the configured plurality of superconducting components, having a linearity of at least 80 dB with respect to a radio frequency input;

providing a radio frequency input; and generating the amplified radio frequency output.

15. The method of claim 14, wherein the plurality of superconducting components each comprise a Superconducting Quantum Interference Device (SQUID).

16. The method of claim 15, wherein the array comprises a plurality of SQUIDs connected in series.

17. The method of claim 16, wherein each SQUID has a loop having a loop area, wherein the distribution of the effective loop areas of the SQUIDs connected in series are defined according to an iterative algorithm which optimizes the linearity of the amplifier output.

18. The method of claim 16, wherein two identical series connected arrays of SQUIDs are biased in a differential manner so as to cancel out even harmonic distortion in a combined output of the two identical series connected arrays of SQUIDs.

19. The method of claim 14, wherein the plurality of superconducting components each comprise a Superconducting Quantum Interference Filter (SQIF).

20. The method of claim 14, where the plurality of superconducting components comprise at least one Bi-SQUID comprising a SQUID shunted by a Josephson junction with parameters optimized so as to generate a triangle-wave output as a function of linear input.

* * * * *